United States Patent [19]

Fister et al.

[11] Patent Number: 4,674,671
[45] Date of Patent: Jun. 23, 1987

[54] THERMOSONIC PALLADIUM LEAD WIRE BONDING

[75] Inventors: Julius C. Fister, Hamden; John F. Breedis, Trumbull, both of Conn.

[73] Assignee: Olin Corporation, New Haven, Conn.

[21] Appl. No.: 794,918

[22] Filed: Nov. 4, 1985

[51] Int. Cl.[4] .......................................... H01L 21/607
[52] U.S. Cl. .................................. 228/111; 228/179; 361/421
[58] Field of Search ................ 228/1.1, 4.5, 110, 111, 228/179; 361/421

[56] References Cited

U.S. PATENT DOCUMENTS

| | | | |
|---|---|---|---|
| 3,357,090 | 12/1967 | Tiffany | 228/110 |
| 3,384,283 | 5/1968 | Mims | 228/4.5 |
| 3,397,451 | 8/1968 | Avedissian et al. | 228/4.5 |
| 3,400,448 | 10/1968 | Helda et al. | 228/179 |
| 3,628,649 | 11/1971 | Keisling | 228/110 X |
| 4,027,326 | 5/1977 | Kummer et al. | 357/67 |
| 4,065,851 | 1/1978 | Kummer et al. | 29/630 |
| 4,098,447 | 7/1978 | Edson et al. | 228/4.5 |
| 4,142,288 | 3/1979 | Flammer et al. | 29/628 |
| 4,437,604 | 3/1984 | Razon et al. | 228/179 |
| 4,513,190 | 4/1985 | Ellett et al. | 228/1.1 X |
| 4,549,059 | 10/1985 | Kamijo et al. | 219/56.21 |

OTHER PUBLICATIONS

Reliability Criteria of New Low-Cost Materials for Bonding Wires and Substrates, by A. Bischoff et al., IEEE, 1984, pp. 411-417.
Ball Bonding with Low Cost Ultrafine Wires, by A. Bischoff et al., IEEE, 1982, pp. 254-261.

Primary Examiner—Kenneth J. Ramsey
Attorney, Agent, or Firm—Barry L. Kelmachter; Howard M. Cohn; Paul Weinstein

[57] ABSTRACT

The present invention relates to a thermosonic wire bonding technique for forming high quality wire interconnections in semiconductor devices. The technique includes using palladium or palladium alloy lead wires to form the wire interconnections between the components of a semiconductor device. The technique also includes forming a protective atmosphere about the palladium lead wire during a portion of the bonding process and controlling the stage temperatures used during the bonding process.

20 Claims, 12 Drawing Figures

THERMOSONIC PALLADIUM LEAD WIRE BONDING

The present invention relates to the bonding of wire leads during the manufacture of semiconductor devices.

Ultrafine wires of aluminum or gold are employed in wire bonding machines to make electrical interconnections between the components of a semiconductor device. The most common wire interconnection made on a semiconductor device is between a conductive pad on a semiconductor chip and a conductor terminal or lead which is adjacent the chip. The conductor terminal is generally part of a lead frame assembly and serves as an output lead to one or more connector pins on the exterior of the package encapsulating the semiconductor chip.

A number of different techniques are used to make these electrical interconnections. One such technique is known as thermocompression bonding. In thermocompression bonding, the wires are bonded to the electrical components by the application of heat and pressure. Generally, each wire bond is formed by heating the component and/or wire to a desired temperature and pressing the wire into contact with the component using a capillary or tool through which the wire passes. U.S. Pat. Nos. 3,397,451 to Avedissian et al., 3,400,448 to Helda et al. and 4,142,288 to Flammer et al. illustrate some typical thermocompression bonding approaches.

Another technique which is frequently employed to form the electrical interconnections makes use of ultrasonic energy to form the wire bonds. In this technique, ultrasonic energy and pressure are applied to a bonding tool. Typically, the lead wire to be bonded to the electrical component passes through the bonding tool. The bond is formed by ultrasonically scrubbing a portion of the wire on a surface of the electrical component. This technique is commonly known as ultrasonic bonding. When heat is applied directly to the electrical component and/or the bonding tool, the process is known as thermosonic bonding. U.S. Pat. Nos. 3,357,090 to Tiffany, 3,384,283 to Mims, 3,623,649 to Keisling, 4,098,447 to Edson et al. and 4,437,604 to Razon et al. illustrate some of the ultrasonic bonding techniques known in the art. In some of these techniques, a protective gas shield is formed about the electrical component and/or the wire. The purpose of this gas shield is to reduce the risk of oxidizing the wire and/or the electrical component during the bonding process.

The lead wires used to form the electrical connections generally comprise ultrafine wires formed from gold, aluminum, or alloys thereof. Experience has shown that there are significant problems associated with the use of wires formed from these materials. For example, most leads and lead frame assemblies are fabricated from copper base materials such as copper alloy C19400. When aluminum or aluminum alloy lead wires are joined to these copper base materials, the copper/aluminum diffusion couple that is formed frequently leads to the formation of undesirable copper-aluminum intermetallic compounds. These intermetallic compounds tend to be brittle and tend to degrade the quality of the bond between the copper and aluminum components. To insure consistent wire bonding and die attachment, the copper base leads and/or lead frames are spot plated with silver, gold, or some other barrier material in those areas where the interconnections are to be made. The need to perform this spot plating can significantly increase the costs associated with the manufacture of the semiconductor device. U.S. Pat. Nos. 4,027,326 and 4,065,851, both to Kummer et al., illustrate a semiconductor device having a spot plated lead frame assembly.

Similar problems exist when gold or gold base alloy lead wires are used to form the electrical interconnections. Typically, semiconductor chips have conductive portions formed by aluminum or aluminum alloy pads. When the gold or gold alloy wires are bonded to the aluminum or aluminum alloy pads, undesirable gold-aluminum intermetallic compounds, known as the purple plague, are often formed. These intermetallic compounds degrade the quality of the bond between the aluminum and gold components.

Precious metal plating of copper or copper alloy lead frames is also used to counter the bonding problems associated with the small amounts of oxides that typically occur on bare or unplated copper or copper base alloy lead frames. Small amounts of copper oxides on unplated lead frames can interfere with gold wire bonding. It has been reported that these copper oxides severely reduce the strength of the bond between a gold lead wire and a bare or unplated copper lead frame. To avoid this problem, it has been necessary to provide bare lead frames having exceptionally clean copper surfaces.

Still another problem associated with the use of gold lead wires involves the quality of the bonds formed between such wires and unplated copper lead frames using thermosonic bonding techniques. It has been discovered that bond quality in this situation can be very much dependent upon the orientation of the wire relative to the direction of the ultrasonic energy scrubbing. Lower wire breaks strengths are generally found with wedge bonds made parallel to the scrubbing direction. These lower wire breaking strengths are believed to be the result of overbonding of the wedge bonds. Finally, the use of gold wire increases the costs associated with producing packaged semiconductor devices.

Semiconductor device manufacturers have frequently expressed a desire to improve the bond quality obtained with current bonding techniques. This is because the reliability of a semiconductor device is measured in terms of the quality of the wire connections between its components. They have also expressed a desire to eliminate the use of precious metals for spot plating and/or for lead wires. The use of precious metals such as silver and/or gold can double or triple manufacturing costs. Still further, they have expressed a desire to have an improved technique for forming high quality wire interconnections between the semiconductor device's components.

Accordingly, it is an object of the present invention to provide a method for forming improved wire bonds.

It is a further object of the present invention to manufacture semiconductor devices having improved bond quality using the above method.

It is yet a further object of the present invention to manufacture semiconductor devices at a reduced cost using the above method.

These and other objects and advantages will become more apparent from the following description and drawings in which like reference numerals depict like elements.

In accordance with the present invention, the electrical interconnections between the components of a semiconductor device are formed using palladium or palladium alloy lead wires. In a preferred embodiment of the present invention, substantially pure palladium lead wires are used. It has been found that palladium lead wires offer several significant benefits over the prior art lead wire materials. First, there is no need to spot plate the lead frame assembly with precious and/or non-precious metals. High quality bonds can be formed between palladium lead wires and bare copper leads and lead frames. Second, palladium base materials do not encounter to the same extent kinetically the intermetallic problems associated with gold and aluminum. Still further, from an economic standpoint, the use of palladium is highly desirable because it is less expensive than gold as a lead wire material.

In a preferred embodiment of the present invention, the palladium lead wires are bonded to the electrical components of a semiconductor device using a thermosonic bonding approach. It has been discovered that high quality bonds can be formed between the palladium lead wires and the electrical components using this approach, particularly if several key bonding steps are performed in accordance with the present invention.

In thermosonic bonding, a ball bond is first formed between the lead wire and a first one of the electrical components such as one of the pads on a semiconductor chip. A ball bond is so named because the end of the lead wire is first fashioned into a ball. Typically, this is done by either creating a spark discharge between the end of the lead wire and an electrode positioned adjacent the wire or using a gas flame to melt the end of the wire. It has been discovered that when palladium is used as a lead wire material, the manner in which this ball is formed is critical.

Palladium tends to be highly sensitive to ambient humidity. When exposed to heat during the ball formation operation, a hydrated palladium chloride film, $PdCl_2.2H_2O$, which adversely affects bond quality, can be formed in ambient environments having relatively high relative humidities and/or trace quantities of chlorine. This film is most likely to occur in atmospheres having a relative humidity greater than 30%. The method of the present invention avoids formation of this film by forming the ball in an inert gas protective atmosphere.

Thermosonic bonding is also characterized by the performance of a pre-bonding heat treatment. In this treatment, the component to which the wire is to be bonded is heated to a desired temperature known as the stage temperature. It has been discovered that when palladium is used as a lead wire material, the stage temperature should be maintained above a certain temperature and preferably within a certain temperature range to obtain the desired improved bond quality. In accordance with the present invention, the stage temperatures used in the thermosonic bonding operation are maintained at a temperature greater than 200° C. Preferably, they are within a temperature range from about 220° C. to about 325° C., most preferably within a temperature range of about 240° C. to about 300° C.

FIG. 1 illustrates a cross sectional view of a semiconductor device.

FIGS. 2(a)–2(g) illustrate a thermosonic bonding operation for forming the electrical interconnections.

Figure 1:
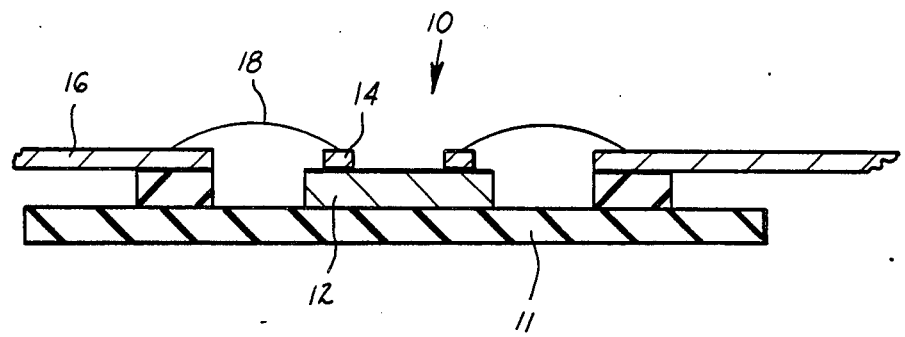

The present invention relates to the use of palladium lead wires in semiconductor devices and to an improved method for bonding palladium lead wires to the various electrical components of such devices. FIG. 1 illustrates a typical semiconductor device 10. The device 10 comprises a semiconductor chip 12 mounted to a base 11. The chip 12 and the base 11 may be formed from any suitable materials known in the art. For example, the chip 12 may be formed from germanium or silicon, while the base 11 may be formed from a metal, a metal alloy, or a non-metallic material such as a ceramic material. The chip 12 and the base 11 may be bonded together in any suitable manner known in the art such as by an adhesive.

A series of lead electrodes or leads 16 from a lead frame assembly not shown are provided to electrically connect the chip 12 with external electrical devices. The electrical connections between the chip 12 and the leads 16 are formed by a plurality of ultrafine lead wires 18. The leads 16 are generally mounted on a non-conductive material such as glass 15 which is in turn mounted on the base 11.

In most devices, the lead wires 18 are formed from gold, aluminum, or alloys thereof. The lead wires 18 are bonded to the chip 12 at a number of sites known as bonding pad electrodes 14. The bonding pad electrodes 14 are typically formed from a metal or metal alloy such as aluminum or an aluminum alloy, although some devices use pads or bumps formed from other metals and metal alloys such as copper, gold, silver and alloys thereof.

After the electrical interconnections have been made between the chip 12 and the leads 16, the semiconductor device is typically encapsulated within a protective structure or package not shown. The protective structure or package is generally formed from a non-conductive material such as a ceramic, an epoxy resin or a polymeric material.

As previously discussed, the use of gold and aluminum lead wires has caused some severe problems. For example, when gold lead wires are bonded to the aluminum or aluminum alloy pads on the semiconductor chip, intermetallic compounds known as the purple plague are frequently formed. These intermetallic compounds severely affect the quality of the bonds formed between the gold wires and the aluminum or aluminum alloy pads and can ultimately lead to failure of the semiconductor device. Another problem associated with gold lead wires involves the degree of cleanliness required for the leads and lead frame assembly. Most leads and lead frame assemblies in use today are formed from copper or a copper base alloy. If the copper or copper alloy surfaces are not substantially oxide free, gold lead wires will not bond well to them. Similar problems exist when aluminum or aluminum alloy lead wires are joined to bare copper or copper alloy leads. The copper/aluminum diffusion couple formed by joining these materials also gives rise to the formation of undesirable intermetallic compounds. To overcome this problem, the leads and/or lead frame assemblies have been spot plated with metals such as silver and gold. Obviously, precious metal spot plating increases the costs associated with production of the semiconductor devices.

Semiconductor devices in accordance with the present invention substantially avoid these problems by using palladium base material lead wires to form the electrical interconnections. In a preferred embodiment of the present invention, the lead wires are formed from a substantially pure palladium material.

It has been discovered that palladium as a lead wire material provides a number of benefits over both gold and aluminum lead wire materials. For example, palladium materials are less sensitive to the presence of oxides on the copper or copper alloy leads and lead frames. This is important because it obviates the need to provide exceptionally clean lead and lead frame materials. Palladium materials also decrease the amount of intermetallic compounds that are formed, particularly at the elevated temperatures encountered during the service life of the semiconductor devices. For example, diffusion couples of gold/aluminum show the first evidence of intermetallic compound formation at temperatures below 150° C. Palladium/aluminum diffusion couples are just starting to develop evidence of intermetallic compounds after exposure to 300° C. temperatures for 5 hours. Still further, palladium materials cost one-third of gold and can be readily bonded to bare copper or copper base alloy materials such as copper base alloy C19400. These last two considerations are important from the standpoint of reducing cost. Finally, palladium lead wires offer the opportunity to obtain increased bond strengths.

Figure 2A:
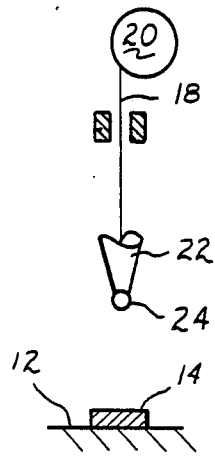
Figure 2B:
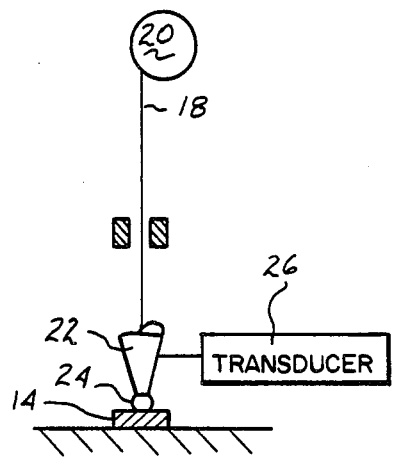

While any suitable bonding technique known in the art may be used to bond the palladium lead wires 18 to the leads 16 and the pads 14, it is preferred to form the electrical interconnections using a thermosonic bonding technique. FIGS. 2(a)-2(g) illustrate a thermosonic bonding operation. A length of lead wire 18 is payed off a reel 20 and passed through a bonding tool 22 (FIG. 2(a)). The end of the lead wire is formed into a ball 24 in a manner to be discussed in more detail hereinafter. The operator not shown positions the bonding tool 22 and the ball end 24 of the lead wire over the target, typically one of the pads 14 on the chip 12. As shown in FIG. 2(b), the ball 24 and the bonding tool 22 are lowered into contact with the pad 14. If desired, the pad 14 may be pre-heated to a desired stage temperature. Ultrasonic energy is then applied to the tool 22 by a device such as a transducer 26. The ultrasonic energy applied to the tool 22 causes the ball 24 of lead wire material to be scrubbed against the surface of the pad 14. The friction between the ball 24 and the pad material creates heat. This heat along with the pressure being applied to the tool 22 form a bond 28 between the pad 14 and the lead wire 18. Any suitable means in the art not shown may be used to apply pressure to the bonding tool 22.

Figure 2C:
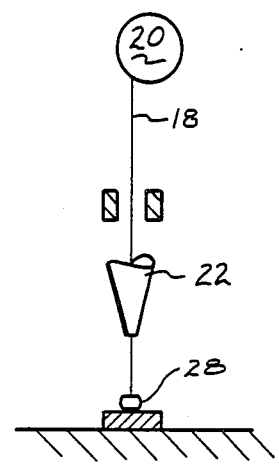
Figure 2D:
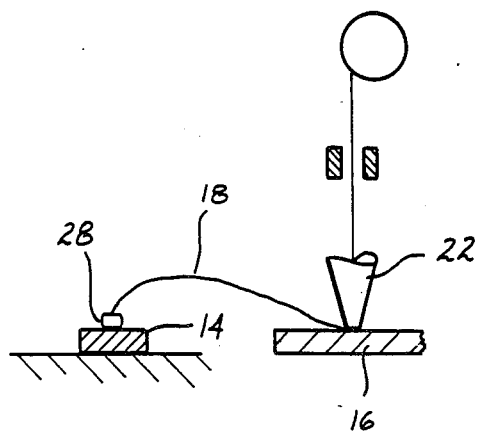

After this first bond 28 known as a ball bond has been formed, the bonding tool 22 is raised to a desired loop height (FIG. 2(c)). The operator then positions the bonding tool 22 over a second target such as one of the leads 16 (FIG. 2(d)). The bonding tool 22 is then lowered to contact the lead 16. This forms a loop of lead wire material. Where the lead wire 18 contacts the lead 16, the second bond or wedge bond 30 is formed. Again, the bond is formed by applying ultrasonic energy and pressure to the bonding tool 22. To facilitate formation of the wedge bond 30, the lead 16 is pre-heated to a desired temperature known as the stage temperature. Any suitable heating device (not shown) known in the art may be used to pre-heat the leads 16.

Figure 2E:
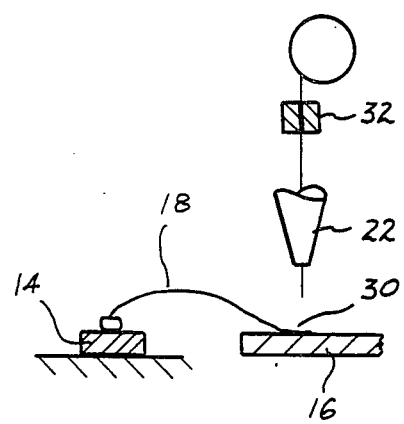
Figure 2F:
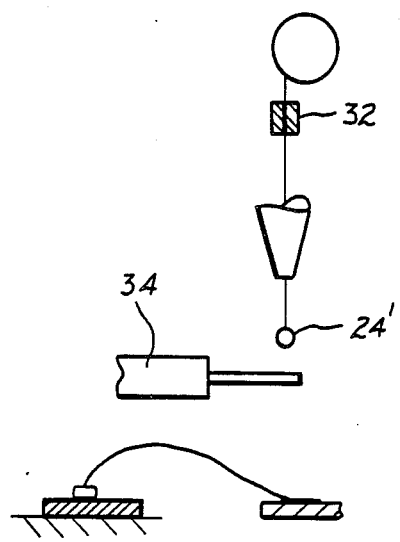
Figure 2G:
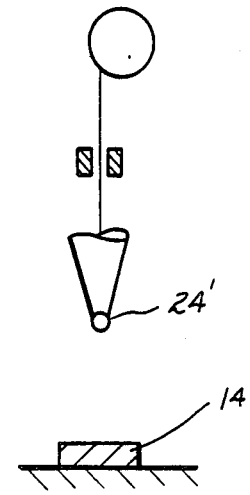

After the wedge bond 30 has been formed, the bonding tool 22 is again raised and a clamp 32 is moved into contact with the lead wire 18 (FIG. 2(e)). The clamp 32 pulls the wire 18 free leaving a substantially tailless bond 30 on the lead 16. After the bonding tool 22 and the lead wire 18 have been returned to a reset position (FIG. 2(f)), an electrode 34 is positioned adjacent the end of the severed lead wire. A spark discharge is created between the electrode 34 and the end of the lead wire by applying an appropriate potential to the electrode. This spark discharge melts the end of the lead wire and forms a new ball 24' of lead wire material. In some systems, a gas flame is used to form the ball in lieu of the electrode 34. After the new ball 24' has been formed, the operator positions the bonding tool over a new target (FIG. 2(g)) and the process is repeated to form a new electrical interconnection.

The use of palladium lead wires with thermosonic bonding offers an opportunity to form high quality electrical interconnections between the lead wires and both leads formed from bare copper or copper base alloys and pads formed from aluminum or aluminum base alloys. These high quality interconnections are typically characterized by excellent breaking stengths in all bonding directions. One of the problems associated with gold lead wires is the quality of the bonds, particularly the second or wedge bond, which can be formed using thermosonic bonding. It has been learned that the quality of thermosonically formed gold lead wire bonds are very much dependent upon the orientation of the gold wire relative to the direction of ultrasonic energy scrubbing. Lower wire break strengths are usually found with wedge bonds made parallel to the scrubbing direction.

To demonstrate the improved breaking strengths which can be obtained using palladium lead wires, the following example was performed.

EXAMPLE I

Two palladium wires representing two tensile strengths and a standard gold bonding wire each 0.001" in diameter were thermosonically bonded to bare, clean copper alloy C19400 coupons. A Kulicke and Soffa Model #479 wire bonder was used to form the wire bonds. Bonding conditions were similar for each of the wires and coupons. Wires were bonded parallel and perpendicular to the ultrasonic energy scrubbing direction. After bonding, the wires were pull tested with a gram gauge and the load to fracture of each wire was measured.

The results summarized in Table I below show that the use of palladium wire relative to gold wire on unplated copper alloy C19400 increases the average pull load which is indicative of higher bond strengths. It also promotes more uniform wire breaking loads relative to the direction of ultrasonic energy scrubbing. The "X" and "Y" directions in Table I are the wedge bond directions perpendicular and parallel, respectively, to the direction of scrubbing from the ultrasonic transducer.

TABLE I

| Average Pull Load | | |
|---|---|---|
| Gold | Palladium A | Palladium B |
| 8 gm min UTS | 14–16 gm UTS | 11.5–14 gm UTS |
| 4–6% Elong | 3.5–6.6% Elong | 7.5–9.5% Elong |
| X        Y | X        Y | X        Y |

TABLE I-continued

| | Average Pull Load | | | | |
|---|---|---|---|---|---|
| Gold | | Palladium A | | Palladium B | |
| 7.5 | 2.5 | 10.3 | 12.5 | 11.1 | 11.8 |

It has been found that certain factors in the thermosonic bonding process are critical to the ability to perform high quality wirebonding. These factors include the atmospheric conditions under which the ball of lead wire material is formed and the stage temperatures which are used. Palladium materials are quite sensitive to atmospheres having relative humidities over 30%, particularly when chlorine is present. In such atmospheres, a hydrated palladium chloride film can be formed even if chlorine is present only in trace quantities. This film, if permitted to be formed, can adversely affect the quality of the subsequently formed bonds. In thermosonic bonding techniques, this problem is most likely to arise during the ball forming step. It has been discovered that this problem can be avoided by forming the ball in a protective inert gas atmosphere.

Figure 3:
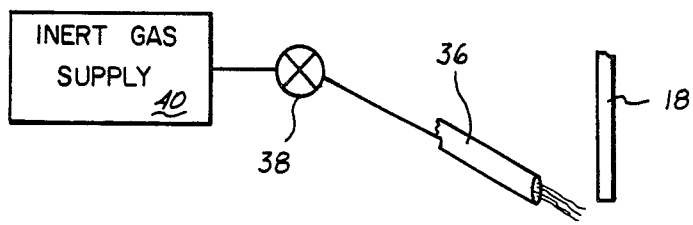
FIG. 3 illustrates a schematic view of an apparatus for forming a ball at the end of a lead wire in accordance with the present invention.

Referring now to FIG. 3, an apparatus for forming the end of a palladium lead wire into a ball in accordance with the present invention is illustrated. The apparatus includes an electrode 34 for creating a spark discharge that melts the end of the lead wire 18 and forms the ball. It should of course be recognized that a gas flame-off device could be used in lieu of the spark discharge electrode 34. The apparatus further includes an inert gas supply 40, a valve 38 to regulate the flow of the inert gas, and a delivery tube 36. The delivery tube 36 is arranged to provide the inert gas to the space between the electrode 34 and the end of the lead wire 18. Any suitable valve known in the art may be used for the valve 38.

It has been suprisingly found that the flow rate of the inert gas into the space between the electrode 34 and the end of the lead wire 18 has an effect on bonding performance. Improvements in bonding performance can be obtained by using a gas flow rate within the range of about 1 SCFH (standard cubic feet per hour) to about 10 SCFH. In a preferred embodiment of the present invention, the gas flow rate is maintained within the range of about 2 SCFH to about 6 SCFH.

The following example was performed to demonstrate the effect of using a protective inert gas atmosphere and of maintaining the gas flow rate within a certain range.

EXAMPLE II

Figure 4:
FIG. 4 is a graph illustrating thermosonic wire bonding performance as a function of protective gas flow rate.
Figure 4:
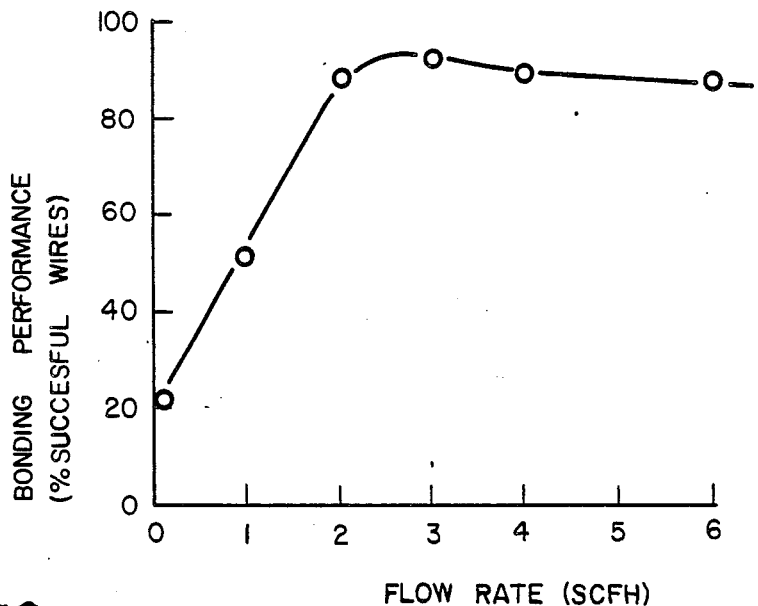

A series of ball bonds were formed between palladium wire samples and a number of bare clean copper alloy C19400 coupons. The bonding operations were conducted at a stage temperature of 200° C. and in an atmosphere having a relative humidity of 47% using a Kulicke and Soffa Model #479 thermosonic wire bonder. Prior to bonding, an end of each wire was formed into a ball using an apparatus similar to that shown in FIG. 3. To study the effect of a protective atmosphere and gas flow rate on bonding performance, nitrogen gas was provided into the area where the ball would be formed at flow rates of 0, 1, 2, 3, 4, and 6 SCFH. As can be seen from FIG. 4, bonding performance was improved as the gas flow rate was increased.

The pre-heating step associated with formation of the bonds has also been found to have an effect on bonding performance. It has been discovered that using stage temperatures higher than about 200° C. can improve bonding performance. Particularly good results may be obtained by using stage temperatures within a range from about 220° C. to about 325° C. In a most preferred embodiment, stage temperatures within the range from about 240° C. to about 300° C. are used. It also has been discovered that maintaining these stage temperatures for times up to about 5 minutes does not significantly affect bonding performance. In comparison, gold wire bondability to bare copper alloy C19400 starts to degrade within sixty seconds at a stage temperature of 200° C.

The following example was performed to demonstrate the effect of stage temperature on bonding performance.

EXAMPLE III

Samples of palladium wires were again thermosonically wire bonded to bare copper alloy C19400 coupons using a Kulicke and Soffa Model #479 wire bonder. Both nitrogen and argon protective atmospheres were used during the bonding operation. The nitrogen and argon gases were provided at a flow rate of 3 SCFH.

Figure 5:
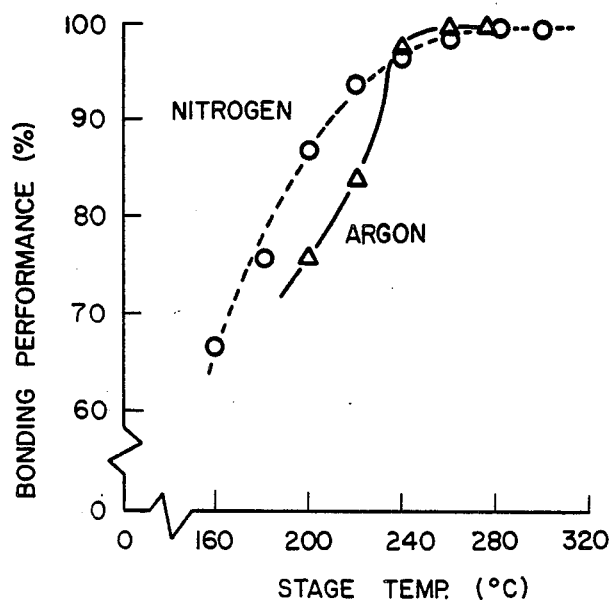
FIG. 5 is a graph illustrating palladium wire bonding performance as a function of stage temperature.
Figure 6:
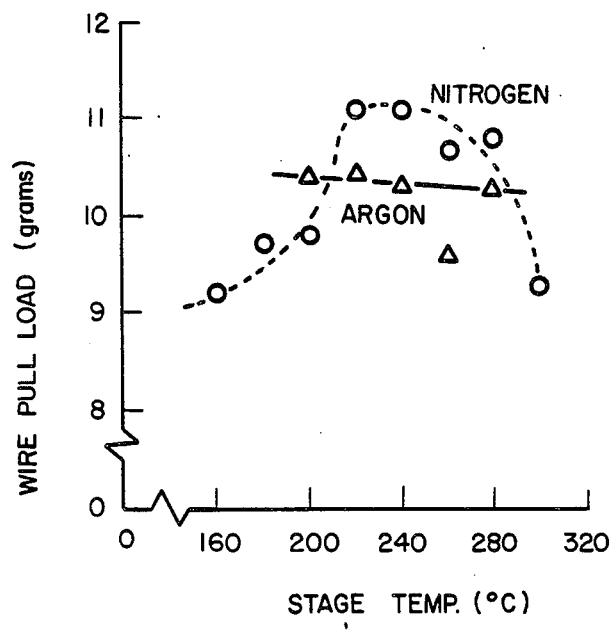
FIG. 6 is a graph illustrating the wire pull loads of thermosonically bonded palladium wires as a function of stage temperature.

As can be seen from FIG. 5, a 100% bonding performance was found over a temperature range of about 260° C. to about 280° C. for argon and over a temperature range of about 280° C. to about 300° C. for nitrogen. As can be seen from FIG. 6, the wire pull loads obtained with a nitrogen protective gas atmosphere increased from about 9.6 grams at a stage temperature of about 160° C. to a maximum of 11.2 grams at stage temperatures in the range of about 220° C. to about 240° C. In argon protective atmospheres, stage temperature had only a minimal effect on wire pull loads.

To study the effect of various cleaning techniques on palladium wire bonding, coupons of copper alloy C19400 were subjected to a number of different cleaning treatments. Samples of C19400 coupons were subjected to the following three treatments: (1) degreasing in methyl alcohol for 15 seconds, rinsing in distilled water, immersion in a 12 vol % $H_2SO_4$ solution at a temperature in the range of 45–50° C. for 15 seconds, rinsing in distilled water, rinsing in a distilled water spray, and wiped dry; (2) acetone degrease by immersion for one minute followed by forced air drying; and (3) vapor degrease for one minute in trichloroethane. After cleaning, the coupons were exposed to thermal conditions similar to those encountered in typical polymer die attachment curing cycles in the following manner. The coupons were first annealed in a $N_2$-4%$H_2$ atmosphere at 275° C. for 60 minutes in order to simulate the thermal exposure required for a polyimide cure. The coupons were then cooled to a temperature below 100° C. before being exposed to ambient air to avoid tarnishing. Wire bonding tests were conducted after these treatments using the Kulicke and Soffa Model #479 wire bonder. Table II below shows the results of this study. It can be seen that from this Table that the type of cleaning treatment used did not affect the ability to obtain excellent bonding performance and relatively high wire break loads.

TABLE II

| Cleaning Treatment | Bonding Performance (%) | Wire Break Load (grams) |
|---|---|---|
| 1 | 100 | 13.2 |
| 2 | 100 | 13.7 |

TABLE II-continued

| Cleaning Treatment | Bonding Performance (%) | Wire Break Load (grams) |
| --- | --- | --- |
| 3 | 100 | 13.6 |

It is believed that the foregoing discussion and examples clearly demonstrate the benefits to be obtained by using palladium and palladium base materials for lead wire bonding and by using the thermosonic bonding technique of the present invention.

While it is preferred to use inert gas atmospheres, other protective atmospheres could be used. For example, a $N_2$-4%$H_2$ atmosphere could be used as a protective atmosphere.

While the lead wire bonding technique of the present invention is intended to be used in conjunction with the bonding of palladium wires, it should be recognized that it may also be used in conjunction with other metal or metal alloy wires.

While it is preferred in accordance with the present invention to bond the palladium lead wires to bare copper or copper base alloy components, the palladium wires may also be bonded, using the present technique, to gold or silver plated copper or copper alloy components if so desired.

The patents set forth in the specification are intended to be incorporated by reference herein.

It is apparent that there has been provided in accordance with this invention a thermosonic palladium lead wire bonding technique which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A method of making a wire interconnection between two electrical components comprising:
   providing a wire formed from a palladium base material;
   forming a first end of said wire into a ball, said ball forming step including forming said ball in an inert gas atmosphere to reduce the influence of ambient humidity on said palladium material;
   positioning said ball of palladium material on a first one of said electrical components;
   forming a first bond between said ball and said first component;
   forming a second bond between a portion of said wire remote from said first end and a second one of said components; and
   heating each said component to a temperature greater than about 200° C. prior to said bond forming steps.

2. The method of claim 1 wherein said ball forming step further includes:
   providing an electrode in an area adjacent said first end of said wire; and
   initiating a spark discharge between said electrode and said first end.

3. The method of claim 2 wherein said ball forming step further includes:
   flowing an inert gas into the area between said electrode and said first end of said wire.

4. The method of claim 3 wherein said flowing step comprises flowing said inert gas into said area at a rate of from about 1 SCFH to about 10 SCFH.

5. The method of claim 3 wherein said flowing step comprises flowing said inert gas into said area at a rate of from about 2 SCFH to about 6 SCFH.

6. The method of claim 1 wherein said first bond forming step comprises applying ultrasonic energy to bond said ball to said first component.

7. The method of claim 1 further comprising:
   heating each said component to a temperature in the range of from about 220° C. to about 325° C.

8. The method of claim 1 further comprising:
   heating each said component to a temperature in the range of from about 240° C. to about 300° C.

9. The method of claim 1 wherein said second bond forming step comprises:
   paying out a length of wire so as to form a wire loop between said components; and
   applying ultrasonic energy to said wire and said second component to form a wedge bond between said wire and said second component.

10. The method of claim 1 wherein:
    said first bond forming step comprises bonding said ball to a semiconductor chip; and
    said second bond forming step comprises bonding said wire to a lead of an unplated copper base alloy lead frame.

11. The method of claim 10 wherein said first bond forming step further comprises bonding said palladium ball to an aluminum or aluminum alloy pad on said chip.

12. The method of claim 1 wherein said wire providing step comprises providing a substantially pure palladium wire.

13. A semiconductor device comprising:
    a first electrical component;
    a second electrical component;
    a lead wire formed from a palladium base material; and
    said lead wire connecting said first and second components and being connected to said components in accordance with the method of claim 8.

14. The semiconductor device of claim 13 wherein:
    said first electrical component comprises a semiconductor chip; and
    said second electrical component comprises a copper or copper base alloy lead frame.

15. The semiconductor device of claim 14 further comprising:
    said lead frame being unplated.

16. The semiconductor device of claim 14 further comprising said lead frame being plated with at least one of gold and silver.

17. The semiconductor device of claim 14 further comprising:
    said lead wire being bonded to an aluminum or aluminum alloy pad on said chip.

18. A method of making a wire interconnection between two electrical components comprising:
    providing a wire formed from a palladium base material;
    forming a first end of said wire into a ball;
    said ball forming step including providing an electrode in an area adjacent said first end of said wire, flowing an inert gas into said area at a flow rate of from about 1 SCFH to about 10 SCFH to reduce the influence of ambient humidity on said palladium base material, and initiating a spark discharge between said electrode and said first end to form said ball;

positioning said ball of palladium material on a first one of said electrical components;

forming a first bond between said ball and said first component;

forming a second bond between a portion of said wire remote from said first end and a second one of said components; and heating each said component to a temperature greater than about 200° C. prior to said bond forming steps.

19. The method of claim 18 wherein said inert gas flowing step comprises flowing said inert gas into said area at a flow rate of from about 2 SCFH to about 6 SCFH.

20. A semiconductor device comprising:
- a first electrical component;
- a second electrical component;
- a lead wire connecting said first and second components; and
- said lead wire being formed from a palladium base material and being bonded to at least one of said components in accordance with the method of claim 18.

* * * * *